(12) United States Patent
Schuster et al.

(10) Patent No.: US 6,882,152 B2
(45) Date of Patent: Apr. 19, 2005

(54) CONNECTION DEVICE FOR POSITIONAL FIXING OF A GRADIENT COIL ASSEMBLY OF A NUCLEAR MAGNETIC RESONANCE TOMOGRAPH

(75) Inventors: Johann Schuster, Oberasbach (DE); Stefan Stocker, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 31 days.

(21) Appl. No.: 10/603,668

(22) Filed: Jun. 25, 2003

(65) Prior Publication Data

US 2004/0046555 A1 Mar. 11, 2004

(30) Foreign Application Priority Data

Jun. 27, 2002 (DE) .......................... 102 28 829

(51) Int. Cl.[7] .................................. G01V 3/00
(52) U.S. Cl. ...................... 324/318; 324/319
(58) Field of Search ................ 324/318, 319, 324/322, 309, 320, 307

(56) References Cited

U.S. PATENT DOCUMENTS 3,774,403 A    11/1973  Cushing ................ 61/16
4,633,708 A    1/1987   Blommaert ............ 324/318
4,889,450 A    12/1989  Anne .................... 405/154
5,345,177 A    9/1994   Sato et al. ............. 324/318
5,698,980 A  * 12/1997  Sellers et al. .......... 324/318
5,793,210 A  *  8/1998  Pla et al. ............... 324/318

FOREIGN PATENT DOCUMENTS

DE   197 22 481       2/2000
EP   0176391 A        2/1986
EP   0269146          1/1988

* cited by examiner

*Primary Examiner*—Brij B. Shrivastav
(74) *Attorney, Agent, or Firm*—Schiff Hardin LLP

(57) ABSTRACT

To position and fix the gradient coil assembly in a basic field magnet assembly of a nuclear magnetic resonance tomograph, an annular clamp element is clamped on a surface of the gradient coil assembly between the gradient coil assembly and the basic field magnet assembly. The clamp element has a conical internal surface which is form-fittingly in contact with a similar surface of the gradient coil assembly, so as to provide a self-centering force on the gradient coil assembly and to maintain the gradient coil assembly with an annular gap between the external surface of the gradient coil surface and the interior surface of the basic field magnet assembly.

14 Claims, 1 Drawing Sheet

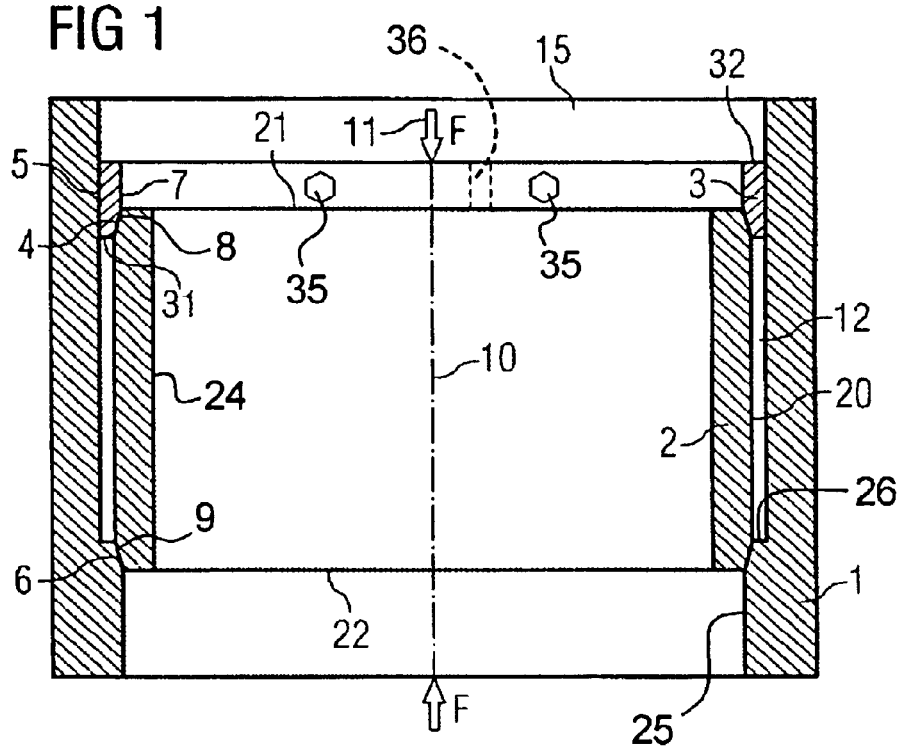
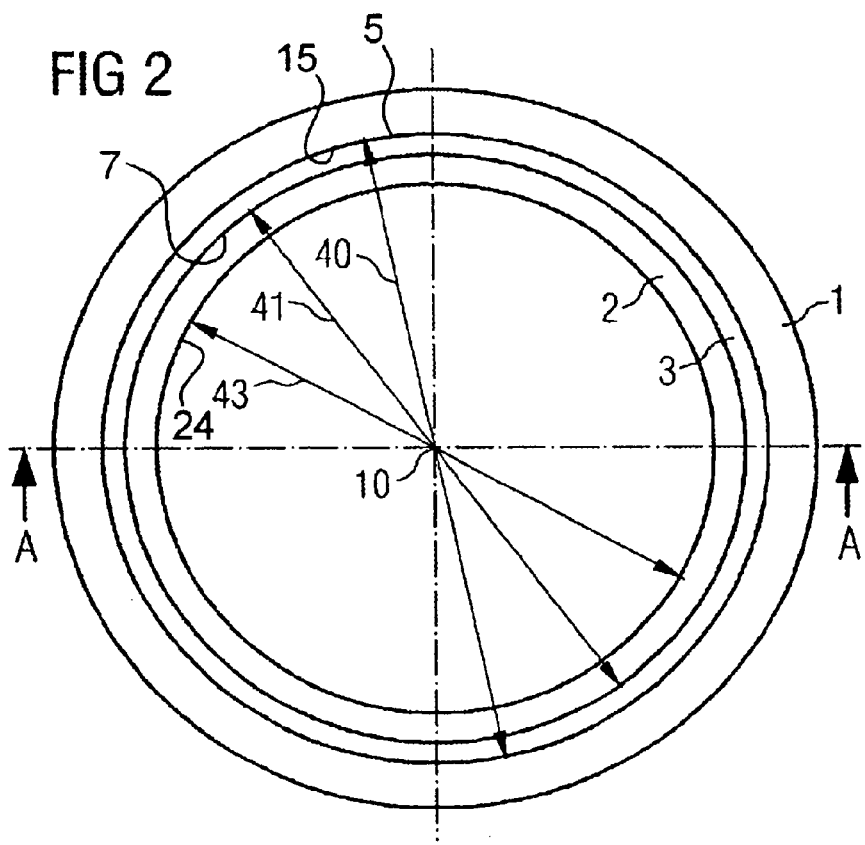

CONNECTION DEVICE FOR POSITIONAL FIXING OF A GRADIENT COIL ASSEMBLY OF A NUCLEAR MAGNETIC RESONANCE TOMOGRAPH

BACKGROUND OF THE INVENTION

The present invention is directed to a connection device for positional fixing of a gradient coil assembly in a basic field magnet assembly of a nuclear magnetic resonance tomograph. The invention is also directed to devices with components that are comparable to those cited. For example, the invention is also applicable in principle when it concerns an assembly that comprises a plurality of tube-shaped segments in a gradient coil assembly.

In particular, the invention is not limited to devices whose relevant components have the designations "gradient coil assembly" and "basic field magnet assembly". Thus the invention also concerns as a matter of course a "magnetic resonance tomograph", for example. In addition, the invention refers to the use of the specified connection device.

A domain of nuclear magnetic resonance tomography is the diagnosis of illnesses of the central nervous system. In particular, cerebral infarcts and the initial stages of multiple sclerosis may be detected earlier with this method than with computer tomography. Nuclear magnetic resonance tomography works without the use of ionized radiation. Consequently, despite the higher cost, nuclear magnetic resonance tomography is a standard instrument today in many large hospitals and practices.

Nuclear magnetic resonance tomography uses what is called the nuclear magnetic resonance of atomic nuclei in a magnetic field under irradiation of electromagnetic waves. The electromagnetic waves required to excite the atomic nuclei are generated by radiofrequency coils that emit pulsed waves. During the pauses between waves, the device receives the nuclear magnetic resonance emitted by the excited atomic nuclei.

In order to be able to visually display multidimensional body sections, the location of the origin of the emitted waves must be determined. In addition to the existing constant magnetic field, which is called the "basic (magnetic) field"), an additional magnetic field, which is known as the "gradient (magnetic) field", is added that exhibits different magnitudes at every location. This gradient magnetic field is generated by the gradient coils. If waves of varying energies are radiated simultaneously, the emitted waves also thus exhibit different energies. Because each energy of the emitted waves is dependent on the magnetic field, and this magnetic field is different at every location in the body, the emitted waves can thus be associated with a specific location in the body.

During operation of a nuclear magnetic resonance tomograph, the basic field magnet assembly generates a static basic field with a magnitude of approximately 0.25 to 3 tesla (T). The gradient coil assembly usually comprises a plurality of coils in order to generate three standing magnetic field gradients perpendicular to one another. Typical values for the field strengths generated by the gradient coils are in the range of approximately 60 millitesla per meter (mT/m).

Each gradient coil is typically permeated by a pulsed current in the range of up to 300 amperes (A) with rise times of less than a millisecond (ms). Lorentz forces thereby affect the conductors of the gradient coils in the magnetic basic field, varying cyclically corresponding to the current flow through the gradient coils. These forces excite the gradient coil assembly to oscillate. The occurring forces are so great that considerable noise exposures of up to more than 100 decibels occur for a person in the nuclear magnetic resonance tomograph during the measurement.

A nuclear magnetic resonance tomograph commonly comprises a cylindrical opening that is primarily bordered by the basic field magnet assembly. A gradient coil assembly is positioned in this opening and fixed in its location. A positional fix as precise as possible plays an important role in terms of the positional resolution during the measurement with a nuclear magnetic resonance tomograph. This is again directly associated with the quality of the measurement results.

The gradient coil assembly commonly exhibits a primarily cylindrical shape. A bed for a person to be examined is located inside the gradient coil assembly.

For the reasons cited above, it is endeavored to position the gradient coil assembly as precisely as possible opposite the basic field magnet assembly and to fix it in this position.

A nuclear magnetic resonance tomograph is known from U.S. Pat. No. 6,107,799, whose disclosure is incorporated herein by reference thereto and which claims priority from DE 197 22 481 C2 and comprises a noise minimizing device to dampen the oscillations of the gradient coil assembly. In an embodiment of this invention, the gradient coil assembly is fixed opposite the basic field magnet assembly via a plurality of discrete wedges.

Due to the use of a plurality of wedges, the positioning and mounting of the gradient coil assembly is relatively elaborate and time-intensive. In addition, discrete forces develop via the use of the wedges that quasi-selectively change or effect the corresponding surface of the gradient coil assembly. This can effect the deformation of the gradient coil assembly and can be a source for measurement inaccuracies.

Alternatively according to the prior art, the gradient coil assembly is fixed opposite the basic field magnet assembly by means of a screwed connection. The previously cited disadvantage can also occur here, since the forces discretely effect the gradient coil assembly.

SUMMARY OF THE INVENTION

The object of the present invention is to provide a connection device for the positional fixing of a gradient coil assembly in an basic field magnet assembly of a nuclear magnetic resonance tomograph, which fixing is simple and easy to obtain.

According to the invention, the positional fixing of the gradient coil assembly ensues by using a clamping element that is annularly shaped and is clamped on the surface of the gradient coil assembly in the intervening space between the gradient coil assembly and the basic field magnet assembly.

The clamping element thereby comprises a conical section-shaped or, respectively, conical internal surface. This internal surface is shaped so that its largest diameter is located either directly at an end surface of the element facing the gradient coil assembly or in any case very near to this end surface.

The smallest diameter of the conical internal surface is located further away from the end surface facing the gradient coil assembly, and, for example, approximately in the middle section between the two end surfaces of the clamp element. In any case, the internal surface is formed so that it can be inserted into the intervening space between the gradient coil assembly and the basic field magnet assembly.

The clamp element can be externally cylindrically formed so that it is substantially form-fittingly connected to the inside of the opening in the basic field magnetic assembly.

If the clamp element is now clamped in the intervening space between the gradient coil assembly and basic field magnet assembly, a wedge effect is produced by the two cited surfaces. This leads to a stiffening of the gradient coil assembly. The result is a minimization of oscillation of the gradient coil assembly, and, in addition thereto, as a consequent of a noise reduction.

The clamp element primarily forms a contiguous, one-piece body that, can, however, comprise bores. These bores can, for example, be provided for current connections or connections for cooling devices. The clamp element can also comprise a gap for such purposes. In this case, the clamp element forms a type of "clip".

According to a an additional aspect of the present invention, the gradient coil assembly comprises—on the surface that is further from the clamp element—a conical section-shaped external surface that is congruent to the conical section-shaped internal surface of the clamp element, so that the clamp element with its internal surface and the gradient coil assembly with the cited external surface form a common form-fitting contact surface.

However, this contact surface can naturally only comprise portions of the internal surface of the clamp element and/or the external surface of the gradient coil assembly. This is the case when the internal surface of the clamp element protrudes in the intervening space between the gradient coil assembly and the basic field magnet assembly. This can, for example, provide technical production advantages.

According to a further aspect of the present invention, the contact surface is axis-symmetrical between the clamp element and the gradient coil assembly. This is particularly emphasized in the case that the gradient coil assembly and the contact surface exhibit a common axis of symmetry.

The advantage is thereby achieved that a force is produced during installation of the gradient coil assembly force that effects a self-centering on the gradient coil assembly.

What is advantageous in this case is that the contact surface and the axis of symmetry describe an angle of between 5 and 15 degrees. This degree range has previously proven useful. However, the invention is not limited to the surfaces of this angular interval.

According to a further aspect of the present invention, the gradient coil assembly and the basic field magnet assembly on the surface of the gradient coil assembly that is on the near side of the clamp element are directly, form-fittingly connected by a second contact surface. This contact surface can be conical if necessary.

This second contact surface can also be axis-symmetrically shaped. In particular, it can comprise a common axis of symmetry with the gradient coil assembly. Again, this provides the same advantages during installation in terms of a self-centering positioning of the gradient coil assembly. The second contact surface can also advantageously describe an angle between 5 and 15 degrees with the axis of symmetry. Again, the invention is not limited to the surfaces of this angular interval.

In the positioning of the gradient coil assembly, a force is exerted upon the clamp element to move the clamp element between the two assemblies, by which the clamp element is wedged through the gap into a final position between the gradient coil assembly and the basic field magnet assembly. This effects the above-cited stiffening of the gradient coil assembly.

The clamp element is advantageously held in this position by agency of bolts and/or studs or similar elements. These bolts can, for example, be mounted at the basic field magnet assembly and—in symmetrical form—effect the force on the clamp element parallel to the axis of symmetry in the direction of the gradient coil assembly.

The clamp element is advantageously made of an electrically non-conductive material. For example, the clamp element can be made from a glass reinforced laminate with an epoxide basis, for example from reinforced laminate 2372 ("2372").

In addition, the invention refers to a nuclear magnetic resonance tomograph that comprises a connection device according to the present invention, and to a use of such a connection device.

Further features, advantages, and attributes should henceforth be explained using a detailed specification of an exemplary embodiment and with reference to the figures of the appended drawings.

BRIEF DESCRIPTION OF THE DRAWINGS

FIG. 1 is a longitudinal cross-sectional view taken along the line A—A in FIG. 2 of a assembly of a gradient coil assembly in a basic field magnet assembly of a nuclear magnetic resonance tomograph; and FIG. 2 is an end view of the assembled parts of the nuclear magnetic resonance tomograph.

DESCRIPTION OF THE PREFERRED EMBODIMENTS

The principles of the present invention are particularly useful when incorporated in a connecting device for holding a gradient coil assembly 2 in a fixed position in a basic field magnetic assembly 1.

The gradient coil assembly 2 is a cylindrical body having a cylindrical outer or external surface 20, a first end surface 21, a second end surface 22 and an inner surface 24 with a diameter 43 (see FIG. 2). Adjacent the first end surface 21, the outer surface 20 has a conical surface 4 and also has a conical surface 6 adjacent the opposite end surface 22.

The basic field magnet assembly 1 has a first internal surface 15, which is cylindrical, with an internal diameter 40 (see FIG. 2) and a second cylindrical surface 25 of a smaller diameter, so as to produce a shoulder 26 therebetween. As illustrated, the shoulder 26 has a corner removed to form a conical internal surface 9.

A clamping element 3 is illustrated as a substantially cylindrical ring-shaped member having a first end 31 and a second end 32. The ring-shaped element 3 has an outer cylindrical surface 5 with an external diameter 40, which is matched to the diameter 40 of the surface 15 of the basic field magnet assembly 1. The ring-shaped element 3 has an internal cylindrical surface 7 with an inner diameter 41 (see FIG. 2). Adjacent the first end 31, the corner formed by the end surface 31 and the internal surface 7 has been removed and formed into a conical surface 8, so that the element 3 has a cross-section with a frustum shape at the end surface 31.

In the illustrated embodiment, the gradient coil assembly 2 is inserted in the basic field magnet assembly 1 with the conical surface 6 adjacent the second end 22 engaging the conical surface 9 to hold that end on an axis 10, which is the axis of symmetry for both the basic field magnet assembly 1 and the gradient coil assembly 2. To lock the gradient coil assembly 2 in place in the interior of the clamping element 3, the clamping element 3 is forced by a force F in the direction of arrow 11 into the interior along the interior surface 15 of the basic field magnet assembly 1 until the conical surface 8 adjacent the first end 31 engages the conical surface 4 of the gradient coil assembly 2. The clamp element 3 holds the assembly 2 on the axis of symmetry 10 with the external surface 20 of the gradient coil assembly 2 being spaced from the interior cylindrical surface 15 of the basic field magnet assembly 1, so that an annular gap 12 is formed therebetween. To hold the element 3 in place, fastening elements, such as bolts or screws 35, which pass through oblong openings in the clamp element 3, are engaged in threaded openings or bores provided in the basic field magnet assembly 1. The oblong holes allow compensation for minor changes or tolerances in the length of the gradient coil assembly 1. As illustrated, the clamping element has an external surface 5 with an outer diameter 40, which is substantially the same or just slightly smaller than the internal diameter of the surface 15 of the basic field magnet assembly, so that the ring-shaped clamping element 3 can be slid along the internal surface 15. The internal diameter 41 of the clamping element 3 is slightly smaller than the external diameter of the surface 20 of the gradient coil assembly 2. The conical surface 8 has a minimum diameter 41 and, as illustrated, has a maximum diameter which is approximately equal to the maximum diameter of the outer surface 20 of the coil 2. The difference between the internal diameter 40 of the basic field magnet assembly I and the outer diameter of the gradient coil assembly 2 is in a range of approximately 5 mm to 10 mm, so that the gap 12 will be 5 mm or less.

As mentioned above, the element 3 is held by the bolts, such as 35, and is provided with one or more bores, such as 36, to allow electrical and/or coolant lines to reach the interior of the space 12 between the gradient coil assembly 2 and the basic field magnet assembly 1.

As illustrated, the conical surface 8 extends from the end 31 to approximately mid-way of the length of the clamp element 3. However, it is possible for it to extend up to the second end surface, such as 32. As mentioned, the internal surface, such as 7, is preferably cylindrically shaped and has the smallest diameter, such as 41, of the conical internal surface of the clamping element 3.

The gradient coil assembly 2 is primarily tube-shaped and has an internal diameter 43. This is sufficiently large so that there is sufficient space inside the gradient coil assembly 2 for a bed for a person who is being examined.

The gradient coil assembly 2 has a conical surface 4 engaging the conical surface 5 when the clamping element 3 is placed in, and this will wedge the assembly 2 in the basic field magnet assembly 1. The conical surfaces are constructed so that the smallest diameter of the surface 4 is less than the largest internal diameter of the surface 8.

The conical internal surface 8 of the clamping element 3 and the conical external surface 4 of the gradient coil 2 are formed on an axis of symmetry, so that they have a common axis of symmetry 10 with the gradient coil assembly 2. Self-centering forces thereby take effect in the wedging of the clamping element 3 during the installation of the gradient coil assembly 2. This is especially advantageous in terms of timesaving installation and a precise positioning of the gradient coil assembly 2.

The gradient of the contact surface formed by the surfaces 4 and 8 with regard to the axis of symmetry 10 can thereby be in an angular range of between 5 and 15 degrees.

The clamping element 3 is preferably comprised of an electrically nonconductive material with a high mechanical strength, such as, for example, HGW 2372.

As mentioned above, bores, such as 36, can be provided in the clamping element 3, through which current connections or connections for cooling devices, which are typical for the gradient coils, can be provided. It is also possible that the clamp elements do not exist in the shape of a closed ring, but rather a ring that has a gap through which these connections can be placed. In this case, the clamp element 3 does not form a closed ring, but rather exhibits a type of clip.

As mentioned above, the gradient coil assembly 2 has a conical surface 6, which engages a conical surface 9 of the basic field magnet assembly 1 when the clamping element urges the gradient coil assembly 2 in the axial direction indicated by the arrow 11. These two contact surfaces are preferably axially symmetrically shaped so that the gradient coil assembly 2 and the contact surface exhibit a common axis of symmetry 10.

The surfaces 6 and 9, like the surfaces 4 and 8, have an angular range relative to the axis of symmetry 10 of a range of 5 to 15 degrees. However, the range is not limited for these contact surfaces. An exact position is made substantially easier by a self-centering moment during the connection installation between the gradient coil assembly 2 and the basic field magnet assembly 1.

Advantages of this invention can be summarized as follows:

A stiffening of the gradient coil assembly occurs due to the primarily annular bracing of the tube-shaped gradient coil assembly;

The stiffening of the gradient coil assembly leads to a minimization of the oscillation and to a reduction in noise;

Compared to conventional methods, the installation of the gradient coil assembly in the basic field magnet assembly can be accomplished with a substantial time savings. Comparatively fewer steps are necessary for fixing, due to the one-piece form of the ring wedge.

A time-consuming positioning of the coil assembly according to the prior art can be dispensed with due to the invention, since the invention can be performed so that it is self-centering.

Although various minor modifications may be suggested by those versed in the art, it should be understood that we wish to embody within the scope of the patent granted hereon all such modifications as reasonably and properly come within the scope of our contribution to the art.

We claim:

1. In a connection device for positioning a gradient coil assembly in a basic field magnet assembly of a nuclear magnetic resonance tomograph, the gradient coil assembly having a primary cylindrical external surface and the basic field magnet assembly having a primary cylindrical opening for receiving the gradient coil assembly, said cylindrical external surface of the gradient coil assembly being located in a fixed state inside the internal cylindrical surface of the basic field magnet assembly with a tube-shaped intervening space therebetween, the improvements comprising the connection device being primarily a closed annular clamp element with a conical internal surface engaging a portion of an external surface of the gradient coil assembly as the clamp element is centered between the gradient coil assembly and the basic field magnet assembly.

2. In a connection device according to claim 1, wherein the clamp element includes at least one element selected from bores and gaps.

3. In a connection device according to claim 1, wherein the clamp element is held clamped by use of at least one element selected from bolts, studs and combinations of bolts and studs between the gradient coil assembly and the basic field magnet assembly.

4. In a connection device according to claim 1, wherein the clamp element is made of an electrical non-conductive material.

5. In a connection device according to claim 1, wherein the gradient coil assembly and the basic field magnet assembly are form-fittingly connected by a conical second contact surface at a surface of the gradient coil assembly opposite the clamp element.

6. In a connection device according to claim 5, wherein the second contact surface is axial-symmetrical.

7. In a connection device according to claim 6, wherein the second contact surface in the axis of symmetry describes an angle of between 5 and 15 degrees.

8. In a connection device for positioning a gradient coil assembly in a basic field magnet assembly of a nuclear magnetic resonance tomograph, the gradient coil assembly having a primary cylindrical external surface and the basic field magnet assembly having a primary cylindrical opening for receiving the gradient coil assembly, said cylindrical external surface of the gradient coil assembly being located in a fixed state inside the internal cylindrical surface of the basic field magnet assembly with a tube-shaped intervening space therebetween, the improvements comprising the connection device being primarily a closed annular clamp element with a conical internal surface engaging a portion of an external surface of the gradient coil assembly as the clamp element is centered between the gradient coil assembly and the basic field magnet assembly, the gradient coil assembly including a conical external surface on the end engaging a conical internal surface of the clamp element and being congruent with the conical internal surface of the clamp element to form a form-fitting first contact surface.

9. In a connection device according to claim 8, wherein the first contact surface is an axis-symmetrical surface.

10. In a connection device according to claim 9, wherein the first contact surface and the axis of symmetry describe an angle of between 5 and 15 degrees.

11. In a connection device according to claim 10, wherein the gradient coil assembly and the basic field magnet assembly are directly, form-fittingly connected by a conical second contact surface on a surface of the gradient coil assembly opposite the end engaged by the clamp element.

12. In a connection device according to claim 11, wherein the second contact surface is axis-symmetrical.

13. In a connection device according to claim 12, wherein the second contact surface and the axis of symmetry describe an angle of between 5 and 15 degrees.

14. In a nuclear magnetic resonance tomograph having a cylindrical gradient coil assembly having an inside diameter to enable insertion of a tray with a patient thereon, said gradient coil assembly being telescopically received in a cylindrical basic field magnet assembly and positioned with an annular spacing between an outer cylindrical surface of the gradient coil assembly and an inner cylindrical surface of the basic field magnet assembly, a connecting device including an annular clamp element with a conical internal surface, said conical internal surface engaging a conical external surface at an end of the gradient coil assembly as the clamp element is inserted between the gradient coil assembly and the basic field magnet assembly.

* * * * *